US 11,293,092 B2

(12) United States Patent
Nakagawasai et al.

(10) Patent No.: US 11,293,092 B2
(45) Date of Patent: Apr. 5, 2022

(54) STAGE DEVICE AND PROCESSING APPARATUS

(71) Applicant: Tokyo Electron Limited, Tokyo (JP)

(72) Inventors: Manabu Nakagawasai, Tokyo (JP); Naoyuki Suzuki, Tokyo (JP); Shinji Orimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 127 days.

(21) Appl. No.: 16/660,700

(22) Filed: Oct. 22, 2019

(65) Prior Publication Data

US 2020/0131625 A1 Apr. 30, 2020

(30) Foreign Application Priority Data

Oct. 25, 2018 (JP) .............................. JP2018-200492

(51) Int. Cl.
*C23C 14/54* (2006.01)
*H01F 41/18* (2006.01)
(Continued)

(52) U.S. Cl.
CPC ............ *C23C 14/541* (2013.01); *C23C 14/34* (2013.01); *C23C 14/505* (2013.01); *H01F 41/183* (2013.01)

(58) Field of Classification Search
CPC ..... C23C 14/541; C23C 14/34; C23C 14/505; C23C 16/4586; C23C 14/56;
(Continued)

(56) References Cited

U.S. PATENT DOCUMENTS 4,599,516 A * 7/1986 Taya ................. H01L 21/67017
165/47
5,429,498 A * 7/1995 Okase ................. C23C 16/4583
257/E21.101
(Continued)

FOREIGN PATENT DOCUMENTS

JP     H11-131230 A     5/1999
JP     2006-073608 A    3/2006
(Continued)

OTHER PUBLICATIONS

JP-2015226010-A Translation (Year: 2015).*
JP-2007298506-A Translation (Year: 2007).*
Yada Piping Solution Co., LTD, Vacuum double wall tube, 2018 (Year: 2018).*
WO-2017221631-A1 Translation (Year: 2017).*

*Primary Examiner* — Jennifer Wecker
*Assistant Examiner* — Patrick S Ott
(74) *Attorney, Agent, or Firm* — Fenwick & West LLP

(57) ABSTRACT

A stage device includes a stage configured to hold a target substrate in a vacuum chamber, a chiller having a cold head maintained at an extremely low temperature and a cold heat transfer body fixed in contact with the cold head and disposed below a bottom surface of the stage with a gap between the stage and the cold heat transfer body. The stage device further includes a heat insulating structure unit having a vacuum insulated structure and configured to surround at least the cold head and a connection portion between the cold head and the cold heat transfer body, cooling fluid supplied to the gap to transfer cold heat of the cold heat transfer body to the stage, and a stage support rotated by a driving mechanism and configured to rotatably support the stage.

19 Claims, 7 Drawing Sheets

(51) Int. Cl.
*C23C 14/34* (2006.01)
*C23C 14/50* (2006.01)

(58) Field of Classification Search
CPC .............. H01F 41/183; H01L 21/67011; H01L 21/67207; H01L 21/68785; H01J 37/32715; H01J 37/32724
USPC ................. 204/298.15, 298.09; 118/724
See application file for complete search history.

(56) References Cited

U.S. PATENT DOCUMENTS

| | | | | |
|---|---|---|---|---|
| 5,676,205 | A | * 10/1997 | White | H01L 21/67103 165/275 |
| 2002/0139307 | A1 | * 10/2002 | Ryding | H01L 21/67109 118/730 |
| 2011/0079963 | A1 | * 4/2011 | Chen | F16C 33/76 277/549 |
| 2012/0193216 | A1 | * 8/2012 | Endo | H01J 37/34 204/192.1 |
| 2015/0075431 | A1 | * 3/2015 | Barriss | C30B 25/12 118/725 |

FOREIGN PATENT DOCUMENTS

| | | | | |
|---|---|---|---|---|
| JP | 2007298506 A | * 11/2007 | | |
| JP | 2011-080719 A | 4/2011 | | |
| JP | 2015-226010 A | 12/2015 | | |
| JP | 2015226010 A | * 12/2015 | ....... | H01L 21/68742 |
| WO | WO-2017221631 A1 | * 12/2017 | ....... | H01L 21/68792 |

* cited by examiner

STAGE DEVICE AND PROCESSING APPARATUS

CROSS-REFERENCE TO RELATED APPLICATION

This application claims priority to Japanese Patent Application No. 2018-200492, filed on Oct. 25, 2018, the entire contents of which is incorporated herein by reference.

TECHNICAL FIELD

The present disclosure relates to a stage device and a processing apparatus.

BACKGROUND

An apparatus for processing a substrate, e.g., a semiconductor substrate or the like, such as a film forming apparatus, performs an extremely low-temperature process. For example, there is known a technique for forming a magnetic film in environment of ultra-high vacuum and an extremely low temperature to obtain a magneto-resistance element having a high magneto-resistance ratio.

As an example of a technique for processing a substrate at an extremely low temperature, Japanese Patent Application Publication No. 2015-226010 discloses a technique for cooling a substrate to an extremely low temperature by a cooling apparatus and forming a magnetic film at an extremely low temperature on the cooled substrate by a film forming apparatus separately provided from the cooling apparatus.

Japanese Patent Application Publication No. 2006-73608 discloses a technique for forming a thin film while cooling a substrate on a cooling stage serving as a wafer support for supporting the substrate to an extremely low temperature. The cooling stage is fixed to a cooling head provided in a vacuum chamber, and the cooling head is cooled by a chiller.

The present disclosure provides a stage device capable of cooling a substrate mounted on a stage to an extremely low temperature with high cooling performance and rotating the substrate in a state where the substrate is cooled to the extremely low temperature, and a processing apparatus including the stage device.

SUMMARY

In accordance with an aspect of the present disclosure, there is provided a stage device including: a stage configured to hold a target substrate in a vacuum chamber; a chiller having a cold head maintained at an extremely low temperature; a cold heat transfer body fixed in contact with the cold head and disposed below a bottom surface of the stage with a gap between the stage and the cold heat transfer body; a heat insulating structure unit having a vacuum insulated structure and configured to surround at least the cold head and a connection portion between the cold head and the cold heat transfer body; cooling fluid supplied to the gap to transfer cold heat of the cold heat transfer body to the stage; and a stage support rotated by a driving mechanism and configured to rotatably support the stage.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

<Processing Apparatus>

Figure 1:
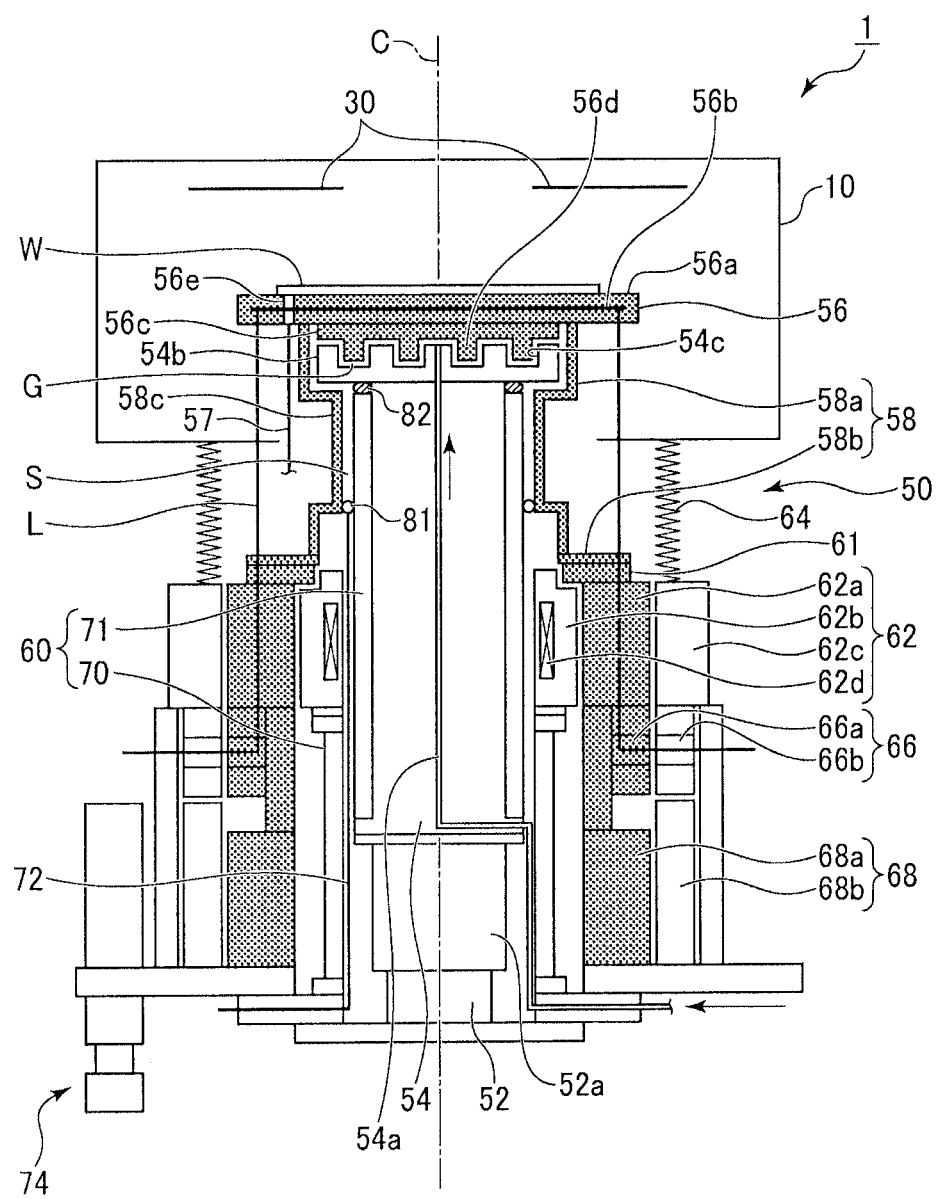
FIG. 1 is a schematic cross-sectional view showing an example of a processing apparatus including a stage device according to an embodiment.

First, an example of a processing apparatus including a stage device according to an embodiment will be described. FIG. 1 is a schematic cross-sectional view showing an example of the processing apparatus.

As shown in FIG. 1, a processing apparatus 1 includes a vacuum chamber 10, a target 30, and a stage device 50. The processing apparatus 1 is configured as a film forming apparatus capable of forming a magnetic film by sputtering on a semiconductor wafer (hereinafter, simply referred to as "wafer") W that is a target substrate in environment of ultra-high vacuum and an extremely low temperature in the vacuum chamber 10. The magnetic film is used for, e.g., a tunneling magneto-resistance (TMR) element.

The vacuum chamber 10 is a processing chamber for processing the wafer W that is the target substrate. The vacuum chamber 10 is connected to a gas exhaust unit (not shown) such as a vacuum pump capable of depressurizing the inside of the vacuum chamber 10 to ultra-high vacuum (e.g., $10^{-5}$ Pa or less). A gas supply line (not shown) is connected from the outside to the vacuum chamber 10. A sputtering gas for sputtering film formation (e.g., nitrogen gas or rare gas such as argon (Ar) gas, krypton (Kr) gas, neon (Ne) gas or the like) is supplied through the gas supply line. A loading/unloading port (not shown) for the wafer W is formed at a sidewall of the vacuum chamber 10, and can be opened and closed by a gate valve (not shown).

The target 30 is disposed at an upper portion of the vacuum chamber 10 to face the wafer W held on the stage device 50. An AC voltage is applied from a plasma generation power supply (not shown) to the target 30. When the AC voltage is applied from the plasma generation power supply to the target 30 in a state where the sputtering gas is introduced into the vacuum chamber 10, plasma of the sputtering gas is generated in the vacuum chamber 10 and the target 30 is sputtered by ions in the plasma. Atoms or molecules of the sputtered target material are deposited on the surface of the wafer W held on the stage device 50. Although the number of targets 30 is not particularly limited, it is preferable to provide a plurality of targets 30 so that films of different materials can be formed by one processing apparatus 1. For example, in the case of depositing a magnetic film (film containing a ferromagnetic material such as Ni, Fe, Co, or the like), the target 30 may be made of, e.g., CoFe, FeNi, NiFeCo, or the like. Alternatively, the target 30 may be made of other materials in addition to those materials.

As will be described later, the stage device 50 cools the wafer W held on the stage 56 to an extremely low temperature while rotating the wafer W.

The processing apparatus 1 further includes an elevation mechanism 74 for vertically moving the entire stage device 50 with respect to the vacuum chamber 10. Therefore, the distance between the target 30 and the wafer W can be controlled. Specifically, the stage device 50 is vertically moved by the elevation mechanism 74, so that the stage 56 can be moved between a transfer position for mounting the wafer W on the stage 56 and a processing position for forming a film on the wafer W mounted on the stage 56.

<Stage Device>

Next, the stage device 50 according to the embodiment will be described in detail.

As shown in FIG. 1, the stage device 50 includes a chiller 52, a cold heat transfer body 54, and a stage 56, a stage support 58, a heat insulating structure unit 60, a seal rotation mechanism 62, and a driving mechanism 68.

The chiller 52 supports the cold heat transfer body 54 and cools an upper surface of the cold heat transfer body 54 to an extremely low temperature (e.g., −30° C. or lower). The chiller 52 has a cold head 52a at an upper portion thereof, and cold heat is transferred from the cold head 52a to the cold heat transfer body 54. The chiller 52 preferably uses Gifford-McMahon (GM) cycle in view of cooling performance. In the case of forming a magnetic film used for a TMR element, it is preferable to cool the cold heat transfer body 54 to a temperature in a range from −123° C. to −223° C. (150K to 50K) by the chiller 52.

The cold heat transfer body 54 is fixed onto the chiller 52 and has a substantially cylindrical shape. The cold heat transfer body 54 is made of a material having high thermal conductivity, such as pure copper (Cu) or the like. An upper part of the cold heat transfer body 54 is disposed in the vacuum chamber 10.

The cold heat transfer body 54 is disposed below the stage 56 such that the center thereof coincides with the central axis C of the stage 56. A first cooling gas supply line (first cooling gas channel) 54a through which a first cooling gas flows is formed in the cold heat transfer body 54 along the central axis C. The first cooling gas is supplied from a gas supply source (not shown) to the first cooling gas supply line 54a. It is preferable to use helium (He) gas having high thermal conductivity as the first cooling gas.

The stage 56 is separated from the upper surface of the cold heat transfer body 54 by a gap G (e.g., 2 mm or less). The stage 56 is made of a material having high thermal conductivity such as pure copper (Cu) or the like. The gap G communicates with the first cooling gas supply line 54a formed in the cold heat transfer body 54. Therefore, the first cooling gas cooled to an extremely low temperature by the cold heat transfer body 54 is supplied to the gap G through the first cooling gas supply line 54a. Accordingly, the cold heat of the chiller 52 is transferred to the stage 56 by the first cooling gas supplied to the cold heat transfer body 54 and the gap G, thereby cooling the stage 56 to an extremely low temperature (e.g., −30° C. or lower). The cooling medium is not limited to the first cooling gas, and the gap G may be filled with another fluid having good thermal conductivity, e.g., thermal grease having good thermal conductivity. In this case, it is not necessary to provide the first cooling gas supply line 54a and, thus, the structure of the cold heat transfer body 54 can be simplified.

The stage 56 includes an electrostatic chuck 56a. The electrostatic chuck 56a has a dielectric film, and a chuck electrode 56b is embedded therein. A predetermined DC voltage is applied to the chuck electrode 56b through a wiring L. Accordingly, the wafer W can be electrostatically attracted and held by an electrostatic force.

The stage 56 has a first heat transfer portion 56c below the electrostatic chuck 56a. A protrusion 56d protruding toward the cold heat transfer body 54 is formed on a bottom surface of the first heat transfer portion 56c. In the illustrated example, the protrusion 56d has two annular parts surrounding the central axis C of the stage 56. The height of the protrusion 56d may be set to be, e.g., in a range from 40 mm to 50 mm. The width of the protrusion 56d may be set to be, e.g., in a range from 6 mm to 7 mm. The shape and the number of the protrusions 56d are not particularly limited. However, it is preferable to set the shape and the number of the protrusions 56d such that the surface area where heat exchange can be sufficiently performed can be obtained in view of improvement of the heat transfer efficiency between the protrusion 56d and the cold heat transfer body 54.

The cold heat transfer body 54 has a second heat transfer portion 54b on an upper surface of a main body thereof, i.e., on the surface facing the first heat transfer portion 56c. A recess 54c into which the protrusion 56d is fitted with the gap G therebetween is formed at the second heat transfer portion 54b. In the illustrated example, the recess 54c has two annular parts surrounding the central axis C of the stage 56. The height of the recess 54c may be equal to that of the protrusion 56d, and may be, e.g., in a range from 40 mm to 50 mm. The width of the recess 54c may be slightly greater than that of the protrusion 56d, and is preferably, e.g., in a range from 7 mm to 9 mm. The shape and the number of the recesses 54c are determined to correspond to those of the protrusion 56d.

The protrusion 56d of the first heat transfer portion 56c and the recess 54c of the second heat transfer portion 54b are fitted with the gap G therebetween, thereby forming a comb-teeth shaped portion. Since the gap G is bent to have a concave-convex pattern due to the comb-teeth shaped portion, the heat transfer efficiency of the first cooling gas between the first heat transfer portion 56c of the stage 56 and the second heat transfer portion 54b of the cold heat transfer body 55 can be increased.

Figure 2:
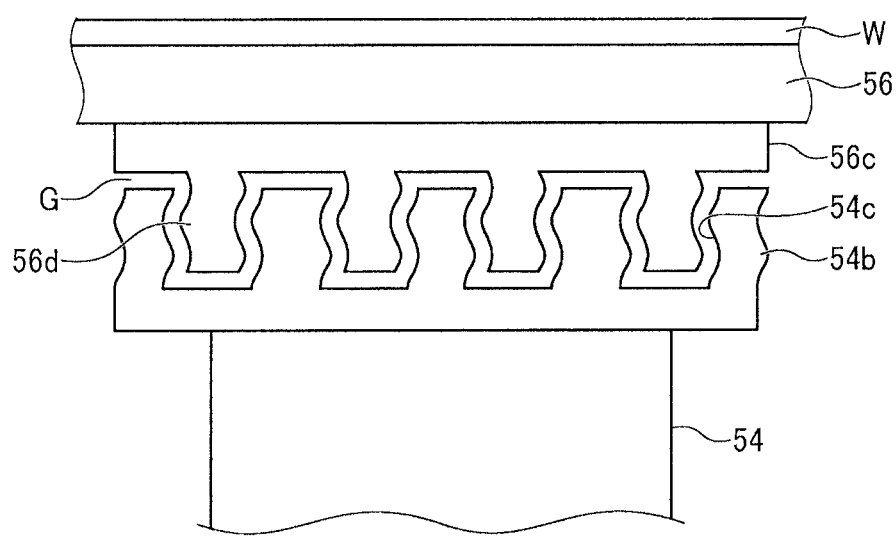
FIG. 2 schematically shows another shape of a comb-teeth shaped portion in the stage device according to the embodiment.

As shown in FIG. 2, the protrusion 56d and the recess 54c may have corrugated shapes corresponding to each other. Each of the surfaces of the protrusion 56d and the recess 54c may have an uneven pattern by blasting or the like. Accordingly, the surface area for the heat transfer can be increased, and the heat transfer efficiency can be further improved.

It is also possible to form the recess at the first heat transfer portion 56c and form the protrusion at the second heat transfer portion 54b.

In the stage 56, the electrostatic chuck 56a and the first heat transfer portion 56c may be formed as one unit, or may be formed separately and adhered to each other. The main body of the cold heat transfer body 54 and the second heat transfer portion 54b may be formed as one unit, or may be molded separately and adhered to each other.

A through-hole 56e is formed through the stage 56 in a vertical direction. A second cooling gas supply line (second cooling gas channel) 57 is connected to the through-hole 56e. A second cooling gas for heat transfer is supplied from the second cooling gas supply line 57 to the backside of the wafer W through the through-hole 56e. It is preferable to use He gas having high thermal conductivity as the second cooling gas, as in the case of the first cooling gas. By supplying the second cooling gas to the backside of the wafer W, i.e., to the gap between the wafer W and the electrostatic chuck 56a, the cold heat of the stage 56 can be efficiently transferred to the wafer W by the second cooling gas. One through-hole 56e may be provided. However, it is preferable to form a plurality of through-holes 56e in order to efficiently transfer the cold heat of the cold heat transfer body 54 to the wafer W.

By separating the gas channel of the second cooling gas to be supplied to the backside of the wafer W from the gas channel of the first cooling gas to be supplied to the gap G, it is possible to supply the cooling gas to the backside of the wafer W at a desired pressure and at a desired flow rate, regardless of the supply of the first cooling gas. It is also possible to continuously supply cooling gas having a high pressure and an extremely low temperature to the gap G, regardless of the pressure, the flow rate, and the supply timing of the gas to be supplied to the backside of the wafer W.

Further, a through-hole connected from the gap G may be formed in the stage 56 so that a part of the first cooling gas as the cooling gas can be supplied to the backside of the wafer W.

The stage support 58 is disposed at an outer side of the cold heat transfer body 54, and the stage 56 is rotatably supported by the stage support 58. In the illustrated example, the stage support 58 has a main body 58a having a substantially cylindrical shape, and a flange portion 58b extending outward at a bottom surface of the main body 58a. The main body 58a is disposed to surround the gap G and the upper outer peripheral surface of the cold heat transfer body 54. Accordingly, the stage support 58 can block the gap G that is the connection portion between the cold heat transfer body 54 and the stage 56. The stage support 58 preferably has a vacuum insulated structure. The main body 58a has a diameter-reduced section 58c at an axially central portion thereof. The main body 58a and the flange portion 58b are made of a metal, e.g., stainless steel or the like.

The heat insulating structure unit 60 is disposed to surround at least the cold head 52a of the chiller 52 and the connection portion between the cold head 52a and the cold heat transfer body 54, and has a vacuum insulated structure. Accordingly, the heat insulating structure unit 60 suppresses the deterioration of the cooling performance of the cold head 52a due to heat input from the outside. The heat insulating body of the heat insulating structure unit 60 preferably insulates the other part of the cold heat transfer body 54.

In the present embodiment, the heat insulating structure unit 60 includes a first heat insulating body 70 and a second heat insulating body 71. The first heat insulating body 70 is disposed to surround the cold head 52a of the chiller 52 and the connection portion (lower part of the cold heat transfer body 54) between the cold head 52a and the cold heat transfer body 54. The second heat insulating body 71 is disposed to surround substantially the entire cold heat transfer body 54. These structures will be described later in detail.

The seal rotation mechanism 62 is disposed below the bottom surface of the flange portion 58b of the stage support 58 via a heat insulating member 61. The heat insulating member 61 has an annular shape that is coaxial with the flange portion 58b. Further, the heat insulating member 61 is fixed to the flange portion 58b, and is made of ceramic such as alumina or the like.

The seal rotation mechanism 62 includes a rotating part 62a, an inner fixing part 62b, an outer fixing part 62c, and a heating member 62d.

The rotating part 62a has a substantially cylindrical shape and extends downward coaxially with the heat insulating member 61. Further, the rotating part 62a is rotated by the driving mechanism 68 while being hermetically sealed with magnetic fluid with respect to the inner fixing part 62b and the outer fixing part 62c. Since the rotating part 62a is connected to the stage support 58 via the heat insulating member 61, the transfer of the cold heat from the stage support 58 to the rotating part 62a is blocked by the heat insulating member 61. Therefore, it is possible to suppress the deterioration of the sealing performance or the occurrence of condensation due to a decrease in the temperature of the magnetic fluid of the seal rotation mechanism 62.

The inner fixing part 62b has a substantially cylindrical shape having an inner diameter greater than an outer diameter of the cold heat transfer body 54 and an outer diameter smaller than an inner diameter of the rotating part 62a. The inner fixing part 62b is disposed between the cold heat transfer body 54 and the rotating part 62a through magnetic fluid.

The outer fixing part 62c has a substantially cylindrical shape having an inner diameter greater than an outer diameter of the rotating part 62a. The outer fixing part 62c is disposed at an outer side of the rotating part 62a through magnetic fluid.

The heating member 62d is embedded in the inner fixing part 62b to heat the entire seal rotation mechanism 62. Accordingly, it is possible to suppress the deterioration of the sealing performance or the occurrence of condensation due to the decrease in the temperature of the magnetic fluid.

With this configuration, the seal rotation mechanism 62 can rotate the stage support 58 in a state where the region communicating with the vacuum chamber 10 is hermetically sealed with magnetic fluid and maintained in a vacuum state.

A bellows 64 is disposed between the upper surface of the outer fixing part 62c and the bottom surface of the vacuum chamber 10. The bellows 64 has a metal bellows structure that can be expanded and contracted in a vertical direction. The bellows 64 surrounds the cold heat transfer body 54, the stage support 58, and the heat insulating member 61, and separates the space in the vacuum chamber 10 and the vacuum space communicating therewith from the space of an atmospheric atmosphere.

A slip ring 66 is disposed below the seal rotation mechanism 62. The slip ring 66 includes a rotating body 66a having a metal ring, and a fixed body 66b having a brush. The rotating body 66a is fixed to the bottom surface of the rotating part 62a of the seal rotation mechanism 62. Further, the rotating body 66a has a substantially cylindrical shape and extends downward coaxially with the rotating part 62a. The fixed body 66b has a substantially cylindrical shape having an inner diameter slightly greater than an outer diameter of the rotating body 66a.

The slip ring 66 is electrically connected to a DC power supply (not shown), and transmits a voltage supplied from the DC power supply to the wiring L via the brush of the fixed body 66b and the metal ring of the rotating body 66a. Accordingly, the voltage can be applied from the DC power supply to the chuck electrode without causing, e.g., torsion of the wiring L. The rotating body 66a of the slip ring 66 is rotated via the driving mechanism 68.

The driving mechanism 68 is a direct driving motor having a rotor 68a and a stator 68b. The rotor 68a has a substantially cylindrical shape and extends coaxially with the rotating body 66a of the slip ring 66. The rotor 68a is fixed to the rotating body 66a. The stator 68b is formed in a substantially cylindrical shape having an inner diameter greater than an outer diameter of the rotor 68a. When the driving mechanism 68 is driven, the rotor 68a rotates. The rotation of the rotor 68a is transferred to the stage 56 via the rotating body 66a, the rotating part 62a, and the stage support 58. Accordingly, the stage 56 and the wafer W thereon rotate with respect to the cold heat transfer body 54. In FIG. 1, the rotating members are illustrated with dots for the sake of convenience.

Although the direct driving motor has been described as an example of the driving mechanism 68, the driving mechanism 68 may be driven via a belt or the like.

A sealing member 81 is disposed between the second heat insulating body 71 and the lower end of the diameter-reduced section 58c of the main body 58a of the stage support 58. A space S sealed with the sealing member 81 is defined by the main body 58a of the stage support 58, the second heat transfer portion 54b of the cold heat transfer body 54, and the upper part of the second heat insulating body 71. The first cooling gas leaked from the gap G flows into the space S. A gas channel 72 is connected to the space S through the sealing member 81. The gas channel 72 extends downward from the space S. A gap between the upper surface of the second heat insulating body 71 and the second heat transfer portion 54b of the cold heat transfer body 54 is sealed with a sealing member 82. The sealing member 82 suppresses the supply of the first cooling gas leaked into the space S to the main body of the cold heat transfer body 54.

The gas channel 72 may discharge the gas in the space S and/or supply the cooling gas to the space S. In any of cases of discharging the gas in the space S and supplying the cooling gas to the space S using the gas channel 72, it is possible to prevent the deterioration of the sealing performance due to the decrease in the temperature of the magnetic fluid by the first cooling gas flowing into the seal rotation mechanism 62. In other words, when the gas channel 72 has a gas discharge function, the first cooling gas leaked into the space S can be discharged before it reaches the seal rotation mechanism 62. When the gas channel 72 has a cooling gas supply function, the third cooling gas is supplied as counterflow to the first cooling gas leaked from the gap G. In order to enhance the function of the third cooling gas as the counterflow, the supply pressure of the third cooling gas is preferably substantially equal to or slightly higher than that of the first cooling gas.

When the gas channel 72 has the gas discharge function, the discharge of the first cooling gas from the gap G is promoted, which makes it possible to supply the fresh first cooling gas from the first cooling gas supply line 54a to the gap G.

When the gas channel 72 has the gas supply function, a gas such as argon (Ar) gas or neon (Ne) gas having low thermal conductivity compared to that of the first cooling gas is supplied as the third cooling gas to prevent condensation.

Since the diameter-reduced section 58c is disposed at the main body 58a of the stage support 58, the volume of the space S can be reduced, and the amount of the first cooling gas leaked into the space S can be reduced. Therefore, the amount of heat exchange with the first cooling gas can be reduced, and the increase in the temperature of the stage support 58 can be suppressed.

The stage device 50 may include a temperature sensor for detecting the temperature of the cold heat transfer body 54, the gap G, and the like. As an example of the temperature sensor, it is possible to use, e.g., a low-temperature sensor such as a silicon diode temperature sensor, a platinum resistance temperature sensor, or the like.

<Heat Insulating Structure Unit>

Next, the heat insulating structure unit 60 of the stage device 50 will be described in detail.

As described above, in the stage device 50, the cold heat of the extremely low-temperature chiller 52 is transferred to the stage 56 through the cold heat transfer body 54, thereby cooling the wafer W on the stage 56 to an extremely low temperature of, e.g., −30° C. or lower. Therefore, the cold head 52a of the chiller 52 and the connection portion between the cold heat transfer body 54 and the cold head 52a are the most significant parts in cooling the wafer W through the stage 56. The other part of the cold heat transfer body 54 is also the significant part in view of transferring the cold heat to the stage 56.

However, the heat source such as the driving mechanism 68 or the magnetic fluid seal exists around the cooling body such as the cold head 52a. Therefore, if the heat is directly transferred to the cold head 52a and its vicinity, the cooling performance of the cold head 52a deteriorates.

Accordingly, the heat insulating structure unit 60 is provided to suppress the heat input from the outside to at least the cold head 52a of the chiller 52 and the connection portion between the cold head 52a and the cold heat transfer body 54. Preferably, the other part of the cold heat transfer body 54 is also insulated in the same manner.

Generally, a member made of a material having low thermal conductivity is selected to increase a heat insulating property thereof. However, in an extremely low-temperature environment of the present embodiment, the material having low thermal conductivity quickly reaches a temperature of the extremely low-temperature environment and, thus, a desired heat insulating effect cannot be obtained. Therefore, in the present embodiment, the heat insulating structure unit 60 having a vacuum insulated structure is provided.

In the present embodiment, the heat insulating structure unit 60 includes a heat insulting body having a vacuum insulated structure (double-walled vacuum pipe structure) that is formed in a cylindrical shape of a double-walled pipe structure inside of which is maintained in a vacuum state. Accordingly, it is possible to effectively suppress the deterioration of the cooling performance due to the heat input from the outside to the cold head 52a.

Specifically, the heat insulating structure unit 60 includes a first heat insulating body 70 and a second heat insulating body 71. The first heat insulating body 70 has a cylindrical shape and is disposed to surround the cold head 52a of the chiller 52 and the connection portion (lower part of the cold heat transfer body 54) between the cold head 52a and the cold heat transfer body 54. The second heat insulating body 71 is formed in a cylindrical shape and is disposed to surround substantially the entire cold heat transfer body 54. Each of the first heat insulating body 70 and the second heat insulating body 71 has the double-walled vacuum pipe structure.

With the first heat insulating body 70, it is possible to suppress the deterioration of the cooling performance due to the heat input from the external component such as the driving mechanism 68 to the cold head 52a and the connection portion between the cold head 52a and the cold heat transfer body 54, which are the most significant parts in view of the cooling performance. Further, with the second heat insulating body 71, it is possible to suppress the deterioration of the cooling performance due to the heat input from, e.g., the magnetic fluid, the first cooling gas flowing in the space S, or the like provided outside thereof to the cold heat transfer body 54.

The second heat insulating body 71 is disposed at an inner side of the first heat insulating body 70 such that the second heat insulating body 71 is partially overlapped with the first heat insulating body 70. Specifically, the first heat insulating body 70 and the second heat insulating body 71 are overlapped at the lower part of the cold heat transfer body 54. With such configuration, it is possible to insulate the cold heat transfer body 54 entirely and improve the heat insulation at the cold head 52a and its vicinity.

Further, with the first heat insulating body 70 and the second heat insulating body 71, it is also possible to suppress the cold heat of the chiller 52 and the cold heat transfer body 54 from being transferred to the outside.

Next, a specific structure of the heat insulating structure unit 60 will be described by illustrating the first heat insulating body 70 as an example.

Figure 3:
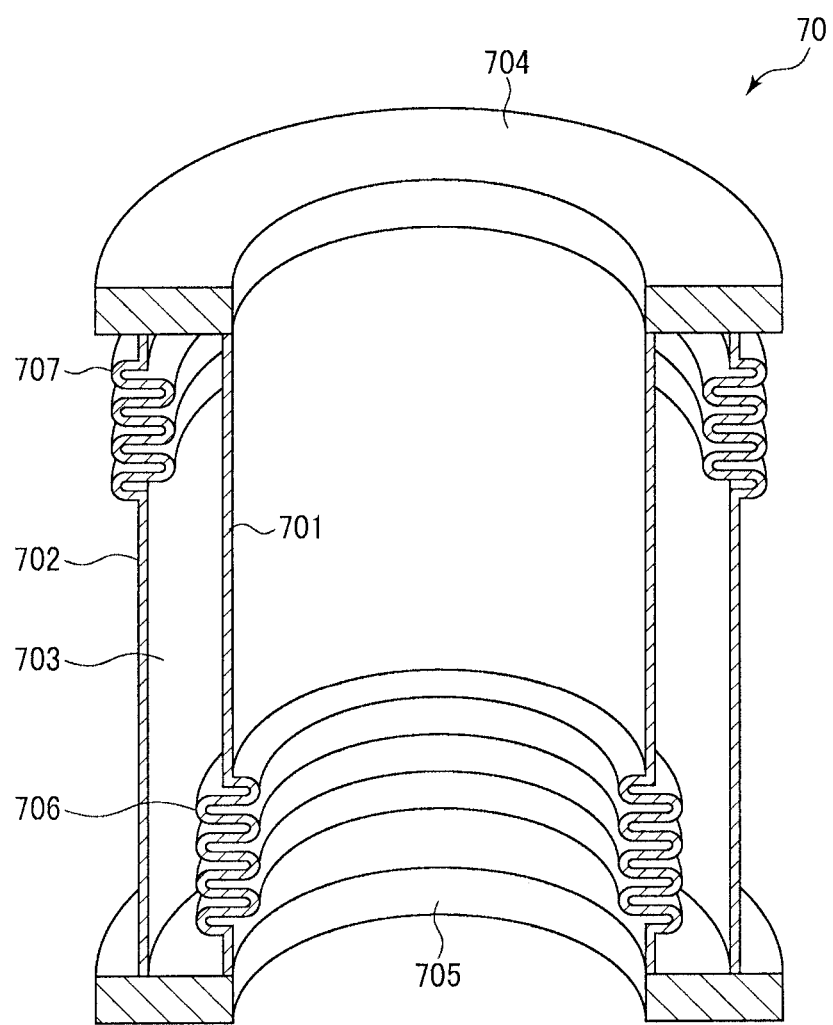
FIG. 3 is a cross-sectional view showing an example of a first heat insulating body of a heat insulating structure unit.

FIG. 3 is a cross-sectional view showing the first heat insulating body 70.

The first heat insulating body 70 is formed in a cylindrical shape and has an inner pipe 701 and an outer pipe 702 that form a double-walled pipe structure. Further, an inner space 703 between the inner pipe 701 and the outer pipe 702 is maintained in a vacuum state, thereby forming a double-walled vacuum pipe structure having a vacuum insulated structure. Flanges 704 and 705 are disposed at an upper end and a lower end of the double pipe, respectively. With this configuration, high heat insulation can be obtained by the inner vacuum space. As the inner pipe 701 and the outer pipe 702 become thinner, the thermal resistance can be increased, which results in the improvement of the heat insulating effect. Each of the inner pipe 701 and the outer pipe 702 has a thickness of, e.g., 0.3 mm.

Figure 4:
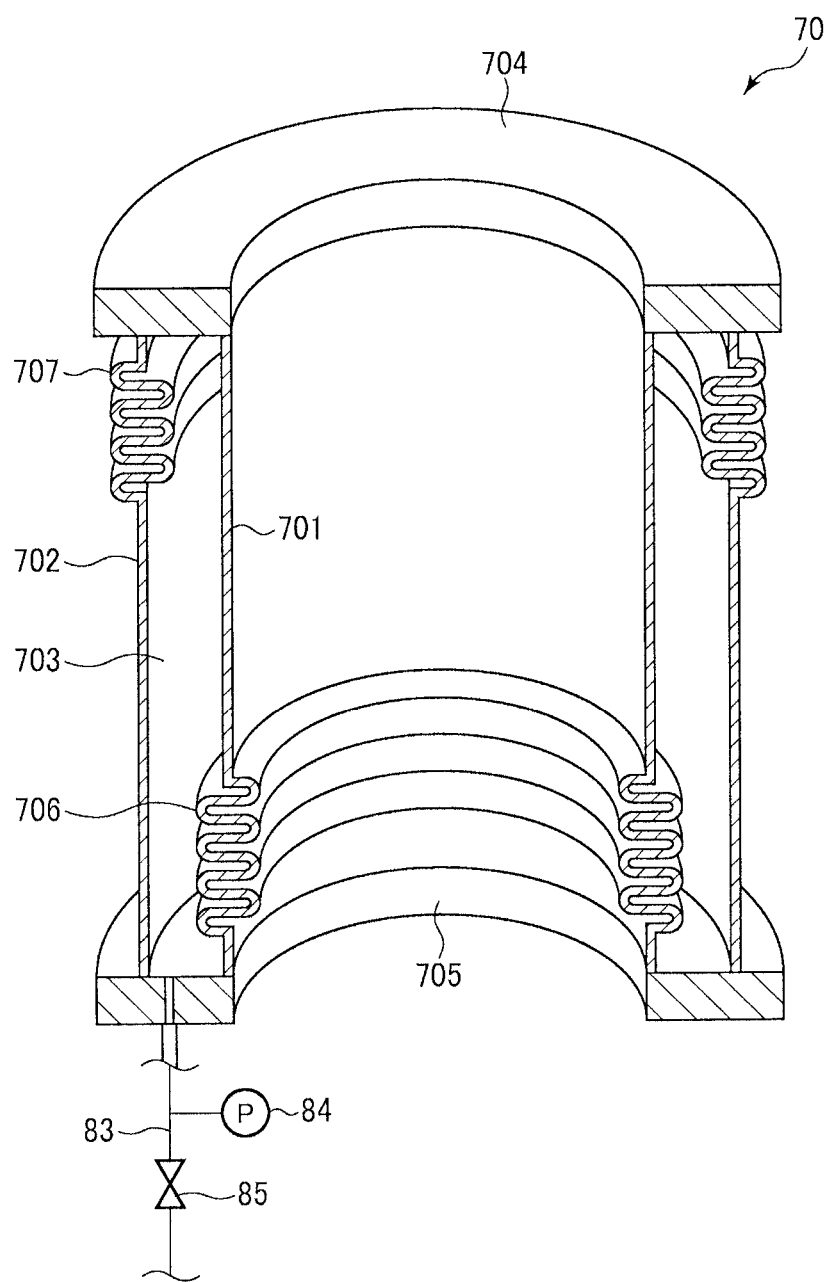
FIG. 4 is a cross-sectional view showing another example of the first heat insulating body of the heat insulating structure unit.

A method for forming the double-walled vacuum pipe structure is not particularly limited. For example, the inner space 703 between the inner pipe 701 and the outer pipe 702 may be evacuated and sealed to constantly serve as a vacuum layer. At this time, a getter material may be inserted into the inner space 703 in order to prevent the decrease in the vacuum level. For example, as shown in FIG. 4, a pipeline 83 connected to a vacuum pump for evacuating the vacuum chamber 10 may be connected to the inner space 703, and a pressure gauge 84 and a valve 85 may be disposed at the pipeline 83. Accordingly, even if the vacuum level of the inner space 703 decreases, the inner space 703 can be evacuated again to increase the vacuum level. Alternatively, only the pressure gauge may be provided to monitor the vacuum level.

The inner pipe 701 and the outer pipe 702 are provided with bellows 706 and 707, respectively. Each of the bellows 706 and 707 may have a thin-walled heat insulating structure (e.g., about 0.15 mm) with a high thermal resistance. The bellows 706 and 707 have a function of alleviating thermal stress caused by thermal contraction/expansion within a temperature range from a room temperature to an extremely low temperature and a function of absorbing stress of the difference between internal pressure and the external pressure. Further, even if the dimensions of the first heat insulating body 70 are within the tolerance, the first heat insulating body 70 may not be attached as a rigid structure due to assembly stack-up tolerance. However, the assembly stack-up tolerance can be absorbed by providing the bellows. In addition, the assembly can be easier by providing the bellows.

The bellows 706 and 707 are preferably disposed at positions separated from each other as shown in FIG. 3. If the bellows 706 and 707 are positioned to be close to each other, the vacuum insulation layer becomes narrower, so that the heat insulating function may deteriorate. Further, since the bellows is easily deformable, the ease of assembly deteriorates when the bellows 706 and 707 are positioned to be close to each other. Preferably, one of the bellows 706 and 707 is provided near by one of the flanges 704 and 705 and the other bellows is provided near by the other flange without being overlapped with each other. Further, by providing the bellows 706 at the height position of the cold head 52a, the heat insulating effect can be further improved.

As the bellows 706 and 707, a molded bellows is preferably used. However, a welded bellows or a formed bellows produced by deep drawing may also be used as long as the above-described functions can be realized.

When it is only necessary to alleviate thermal stress, the bellows may be provided only at the inner pipe 701. When the above-described functions are not necessary, the bellows may not be provided.

Figure 5:
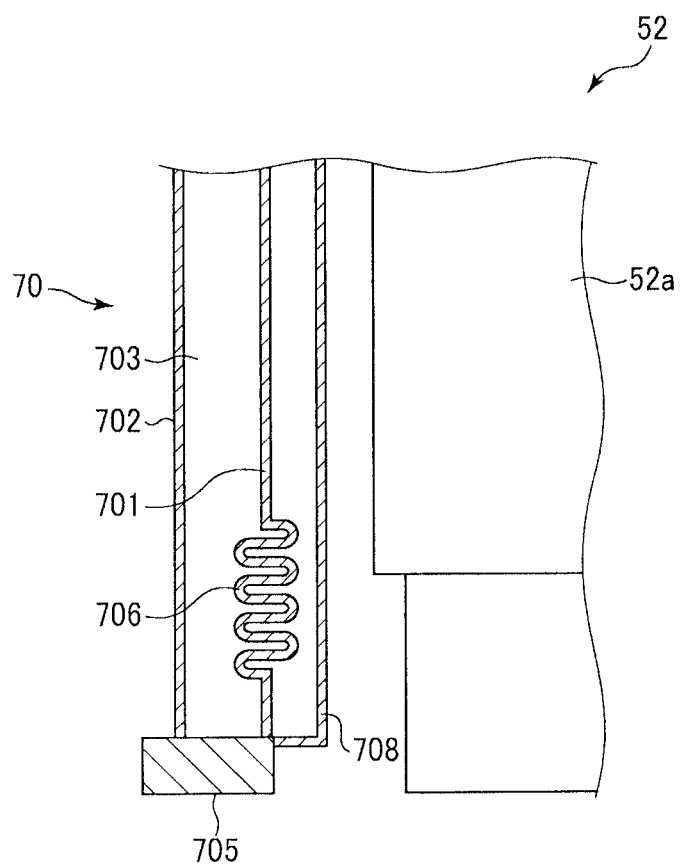
FIG. 5 is a cross-sectional view showing still another example of the first heat insulating body of the heat insulating structure unit.
Figure 6:
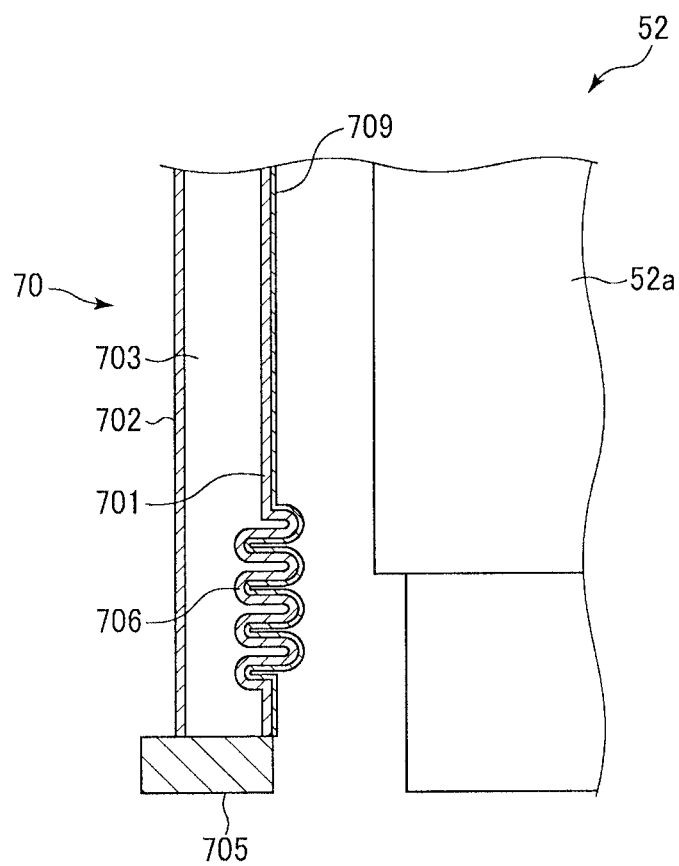
FIG. 6 is a cross-sectional view showing further still another example of the first heat insulating body of the heat insulating structure unit.

In addition, as shown in FIG. 5, the first heat insulating body 70 may have a radiant heat shielding plate 708 at an inner side of the inner pipe 701. Therefore, the radiant heat transferred from the double-walled vacuum pipe to the cold head 52a or the cold heat transfer body 54 can be suppressed. The radiant heat shielding plate 708 is made of a material having a low emissivity, such as aluminum or the like. The radiant heat shielding plate 708 may have different emissivities on the front side and the backside thereof. The radiant heat shielding plate 708 is not limited to a simple plate, and may be a multilayer plate, a corrugated plate, or the like. Alternatively, the radiant heat shielding plate 708 may have holes for discharging gas.

Alternatively, the first heat insulating body 70 may have a radiant heat shielding film 709 at the inner side of the inner pipe 70, e.g., on the inner side surface of the inner pipe 701. The radiant heat shielding film 709 is made of a material having a high heat shielding property, such as aluminum or the like.

The second heat insulating body 71 basically has the same double-walled vacuum pipe structure as that of the first heat insulating body 70. Similarly to the first heat insulating body 70, the second heat insulating body 71 may include bellows, a radiant heat shielding plate, and/or a radiant heat shielding film. Since, however, absorption of the assembly stack-up tolerance may not be necessary for the second heat insulating body 71, it may be sufficient to provide the bellows only at the inner pipe to absorb the thermal stress.

Figure 7:
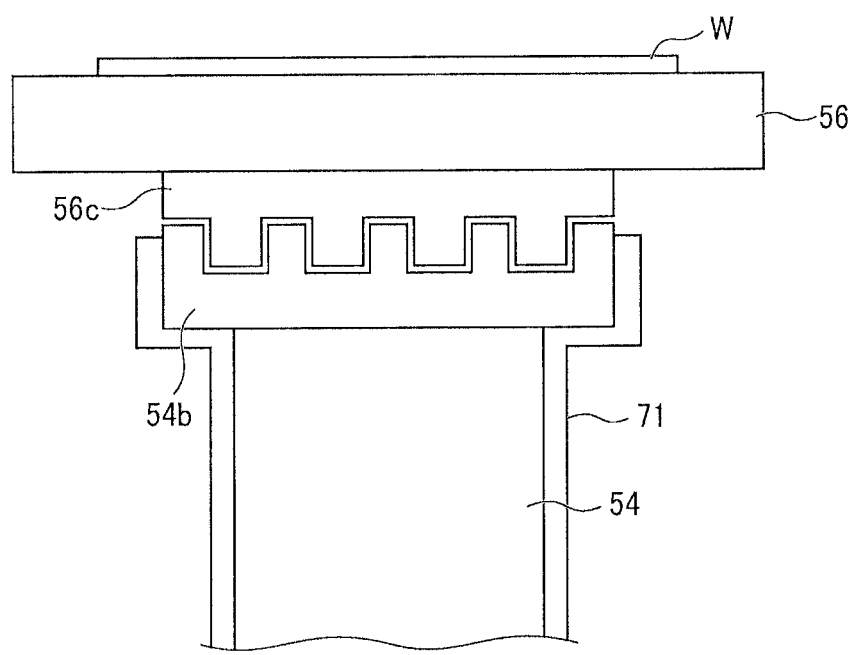
FIG. 7 is a cross-sectional view showing an example of a second heat insulating body of the heat insulating structure unit.

As shown in FIG. 7, the second heat insulating body 71 may extend upto the second heat transfer portion 54b forming the comb-teeth shaped portion. Accordingly, the heat insulating effect for the cold heat transfer body 54 can be further improved.

In the present embodiment, the heat insulating structure unit 60 is divided into the first heat insulating body 70 and the second heat insulating body 71 in view of assemblability or the like. However, the first heat insulating body 70 and the second heat insulating body 71 may be integrally formed to entirely insulate the cold head 52a of the chiller 52 and the cold heat transfer body 54.

<Operation of the Processing Apparatus and Effect of the Stage Device>

In the processing apparatus 1, the vacuum chamber 10 is evacuated to be in a vacuum state and the chiller 52 of the stage device 50 is operated. The first cooling gas is supplied to the gap G through the first cooling gas supply line 54a.

Then, the stage device 50 is moved (lowered) by the elevation mechanism 74 to allow the stage 56 to reach the transfer position. The wafer W is transferred from a vacuum transfer chamber (not shown) into the vacuum chamber 10 and mounted on the stage 56 by a transfer device (not shown). Next, a DC voltage is applied to the chuck electrode 56b, and the wafer W is electrostatically attracted and held by the electrostatic chuck 5.

Thereafter, the stage device 50 is moved (lifted) by the elevation mechanism 74 to allow the stage 56 to reach the processing position. At the same time, a pressure in the vacuum chamber 10 is adjusted to ultra-high vacuum (e.g., $10^{-5}$ Pa or less) that is a processing pressure. Then, the driving mechanism 68 is driven, and the rotation of the rotor 68a is transferred to the stage 56 through the rotating body 66a, the rotating part 62a, and the stage support 58. Accordingly, the stage 56 and the wafer W mounted thereon are rotated with respect to the cold heat transfer body 54.

At this time, in the stage device 50, the stage 56 is separated from the fixed cold heat transfer body 54, and thus can be rotated by the driving mechanism 68 via the stage support 58. Further, the cold heat transferred from the chiller 52 maintained at an extremely low temperature to the cold heat transfer body 54 is transferred to the stage 56 by the first cooling gas supplied to the narrow gap G of 2 mm or less. Then, the wafer W is attracted to and held on the electrostatic chuck 56a while the second cooling gas is supplied to the backside of the wafer W, so that the wafer W can be efficiently cooled by the cold heat of the stage 56. Accordingly, it is possible to rotate the wafer W together with the stage 56 while maintaining the temperature of the wafer W at an extremely low level, e.g., −30° C. or lower.

At this time, the gap G is bent to have a concave-convex pattern due to the comb-teeth shaped portion formed between the first heat transfer portion 56c of the stage 56 and the second heat transfer portion 54b of the cold heat transfer body 54. Therefore, the heat is efficiently transferred from the cold heat transfer body 54 to the stage 56.

While rotating the wafer W, a voltage is applied from a plasma generation power supply (not shown) to the targets 30 while introducing the sputtering gas into the vacuum chamber 10. Accordingly, plasma of the sputtering gas is generated, and the targets 30 are sputtered by ions in the plasma. Atoms or molecules of the sputtered targets are deposited on the surface of the wafer W maintained at an extremely low temperature on the stage device 50, thereby forming a desired film, e.g., a magnetic film for a TMR element having a high magneto-resistance ratio.

In the conventional case where the cooling apparatus and the film forming apparatus are provided separately as described in Japanese Patent Application Publication No. 2015-226010, it is difficult to maintain high cooling performance and the number of apparatuses increases. In the conventional technique disclosed in Japanese Patent Application Publication No. 2006-73608, the substrate can be cooled to an extremely low temperature using the cooling head cooled by the chiller in the film forming chamber. Since, however, the stage is fixed, it is difficult to perform uniform film formation.

On the other hand, in the present embodiment, the stage 26 and the cold heat transfer body 54 for transferring the cold heat of the chiller 52 maintained at an extremely low temperature are separately disposed with the gap G therebetween. Further, the cooling gas is supplied to the gap G, and the stage can be rotated via the stage support 58. Accordingly, it is possible to achieve both of the high cooling performance for the wafer W and the uniform film formation.

For example, when a magnetic film for a TMR element is formed, the wafer W may be transferred at a high temperature of 100° C. to 400° C. to the stage 56. Since it is required to cool such a high-temperature wafer W to an extremely low temperature of 50K to 150K (−223° C. to −123° C.), e.g., 100K (−173° C.), the high cooling performance of the chiller 52 should be maintained to cool the wafer W to a desired cooling temperature.

Therefore, in the present embodiment, the heat insulating structure unit 60 having the vacuum insulated structure is provided to surround at least the outer peripheral surface of the cold head 52a of the chiller 52 and the connection portion between the cold head 52a and the cold heat transfer body 54 which directly affects the cooling performance. Accordingly, the heat input from the outside to at least the cold head 52a and the connection portion between the cold head 52a and the cold heat transfer body 54 can be suppressed, and the high cooling performance can be maintained.

Further, the heat input from the outside to the other part of the cold heat transfer body 54 in addition to the part corresponding to the connection portion can be suppressed by allowing the heat insulating structure unit 60 to surround the outer peripheral surface of the other part of the cold heat transfer body 54. This makes it possible to suppress the deterioration of the cooling performance due to the heat input from the outside to the cold heat transfer body 54. Hence, the cooling temperature thereto from the cold head 52a of the chiller 52 can be maintained at a low level, and the cooling efficiency of the cold heat transfer body 54 is improved. Accordingly, the cooling time can be shortened, and the consumption amount of the first cooling gas can be reduced, which makes it possible to realize film formation at an extremely low temperature with a low cost while ensuring a high throughput.

Further, the high heat insulating effect can be obtained by allowing the heat insulating structure unit 60 to have the above-described double-walled vacuum pipe structure. Furthermore, by allowing the heat insulating structure unit 60 to include the first heat insulating body 70 and the second heat insulating body 71 each of which has the double-walled vacuum pipe structure, the heat input to the cold head 52a of the chiller 52 and the cold heat transfer body 54 can be efficiently suppressed. Accordingly, the cooling performance can be improved.

In addition, by providing the bellows at the inner pipe and the outer pipe of the double-walled vacuum pipe structure, the heat insulating structure having a high thermal resistance can be obtained. Further, by providing the bellows, it is possible to realize the function of alleviating the thermal stress caused by thermal contraction/expansion within a temperature range from a room temperature to an extremely low temperature, the function of absorbing the stress of the difference between internal pressure and the external pressure, the function of absorbing the assembly stack-up tolerance, and the function of facilitating assembly.

Further, by disposing the radiant heat shield such as the radiant heat shielding plate 708, the radiant heat shielding film 709, or the like at the inner side of the double-walled vacuum pipe structure, the radiant heat transferred from the double-walled vacuum pipe to the cold head 52a and/or the cold heat transfer body 54 can be suppressed. Accordingly, the deterioration of the cooling performance can be suppressed more effectively.

Since the stage support 58 that is in direct contact with the stage 56 and receives heat from the heat generating part such as magnetic fluid seal or the like has a vacuum insulated structure, it is possible to suppress the heat input from the heat generating part such as the magnetic fluid seal or the like to the stage 56 via the stage support 58. Accordingly, the cooling performance can be further improved.

<Other Applications>

The above-described embodiments are considered to be illustrative in all aspects and not restrictive. The above-described embodiments may be omitted, replaced, or changed variously without departing from the scope and the gist of the following claims.

For example, the configuration of the heat insulating structure unit 60 is merely an example. As described above, the heat insulating structure unit 60 may be integrally formed to surround over the cold head 52a and the cold heat transfer body 54. Further, the heat insulating structure unit 60 may include only the first heat insulating body 70. Although the above-described embodiments have described the case where the present disclosure is applied to the sputtering film formation of the magnetic film used for the TMR element as an example, the present disclosure is not limited thereto as long as a uniform process is required at an extremely low temperature.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A stage device comprising:
a stage configured to hold a target substrate in a vacuum chamber;
a chiller having a cold head maintained at a temperature of −30° C. or lower;
a cold heat transfer body fixed in contact with the cold head and disposed below a bottom surface of the stage with a gap between the stage and the cold heat transfer body;
a heat insulating structure unit having a vacuum insulated structure and configured to surround at least the cold head and a connection portion between the cold head and the cold heat transfer body;
cooling fluid supplied to the gap to transfer cold heat of the cold heat transfer body to the stage; and
a stage support rotated by a driving mechanism and configured to rotatably support the stage,
wherein the heat insulating structure unit includes a first heat insulating body having a double-walled vacuum pipe structure disposed to surround the cold head and the connection portion between the cold head and the cold heat transfer body, and a second heat insulating body having a double-walled vacuum pipe structure disposed to surround substantially the entire cold heat transfer body, wherein the first heat insulating body and the second heat insulating body are partially overlapped.

2. The stage device of claim 1, wherein the double-walled vacuum pipe structures of the first heat insulating body and the second heat insulating body include an inner pipe and an outer pipe, wherein an inner space between the inner pipe and the outer pipe is maintained in a vacuum state.

3. The stage device of claim 2, wherein at least one of the double-walled vacuum pipe structures of the first heat insulating body and the second heat insulating body has a bellows disposed at least at the inner pipe.

4. The stage device of claim 3, wherein at least one of the double-walled vacuum pipe structures of the first heat insulating body and the second heat insulating body has the bellows disposed at the inner pipe and the outer pipe.

5. The stage device of claim 4, wherein one of the bellows disposed at the inner pipe and the outer pipe is disposed at one end of the double-walled vacuum pipe structure, and the other bellows is disposed at the other end of the double-walled vacuum pipe structure.

6. The stage device of claim 2, wherein at least one of the first heat insulating body and the second heat insulating body has a radiant heat shield at an inner side of the double-walled vacuum pipe structure.

7. The stage device of claim 2, further comprising a vacuum-evacuable pipeline connected to the inner space and a pressure gauge and a valve connected to the pipeline, wherein the inner space is evacuated through the pipeline when a vacuum level in the inner space is reduced.

8. The stage device of claim 1, wherein the second heat insulating body is disposed to surround a connection portion between the cold heat transfer body and the stage.

9. The stage device of claim 1, wherein the stage support is rotated via a rotating part that is rotated by a driving mechanism while being sealed with magnetic fluid.

10. The stage device of claim 2, wherein the stage includes an electrostatic chuck configured to attract and hold the target substrate.

11. The stage device of claim 10, wherein the cooling fluid supplied to the gap is a first cooling gas, and the first cooling gas is supplied to the gap through a first cooling gas channel formed in the cold heat transfer body.

12. The stage device of claim 11, wherein a second cooling gas for heat transfer is supplied to a gap between the target substrate and the electrostatic chuck through a second cooling gas channel different from the first cooling gas channel.

13. The stage device of claim 11, wherein the first cooling gas is supplied to a gap between the target substrate and the electrostatic chuck through a gas channel communicating with the first cooling gas channel.

14. The stage device of claim 11, wherein a space is formed between the stage support and the double-walled vacuum pipe structure of the second heat insulating body and the first cooling gas leaked from the gap flows into the space, the space being sealed with a sealing member, and
a gas channel is connected to the space to discharge the first cooling gas in the space or supply a second cooling gas as counterflow to the first cooling gas into the space.

15. The stage device of claim 1, wherein the stage support has a vacuum insulated structure.

16. The stage device of claim 1, wherein a connection portion between the stage and the cold heat transfer body has a comb-teeth shaped portion such that the gap between the stage and the cold heat transfer body has a concave-convex pattern.

17. A processing apparatus comprising:
a vacuum chamber;
a stage device configured to rotatably support a target substrate in the vacuum chamber, the stage device comprising:

a stage configured to hold the target substrate in a vacuum chamber, a chiller having a cold head maintained at a temperature of −30° C. or lower, a cold heat transfer body fixed in contact with the cold head and disposed below a bottom surface of the stage with a gap between the stage and the cold heat transfer body, a heat insulating structure unit having a vacuum insulated structure and configured to surround at least the cold head and a connection portion between the cold head and the cold heat transfer body, cooling fluid supplied to the gap to transfer cold heat of the cold heat transfer body to the stage, and a stage support rotated by a driving mechanism and configured to rotatably support the stage; and a processing mechanism configured to process the target substrate in the vacuum chamber, wherein the heat insulating structure unit includes a first heat insulating body having a double-walled vacuum pipe structure disposed to surround the cold head and the connection portion between the cold head and the cold heat transfer body, and a second heat insulating body having a double-walled vacuum pipe structure disposed to surround substantially the entire cold heat transfer body, wherein the first heat insulating body and the second heat insulating body are partially overlapped.

18. The processing apparatus of claim 17, wherein the processing mechanism includes a target for sputtering film formation, the target being disposed above the stage in the vacuum chamber.

19. The processing apparatus of claim 18, wherein the target is made of a material forming a magnetic film used for a tunneling magneto-resistance element.

* * * * *